United States Patent [19]

Yokoyama

[11] 4,430,625

[45] Feb. 7, 1984

[54] POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 227,999

[22] Filed: Jan. 23, 1981

[30] Foreign Application Priority Data

Jan. 24, 1980 [JP] Japan .................................. 55-7324

[51] Int. Cl.³ .......................... H03F 3/04; H03F 3/38
[52] U.S. Cl. ..................................... 330/297; 330/10
[58] Field of Search ................ 330/10, 262, 267, 273, 330/296, 297

[56] References Cited

U.S. PATENT DOCUMENTS 4,115,739  9/1978  Sano et al. ........................... 330/297
4,218,660  8/1980  Carver ................................. 330/297

*Primary Examiner*—James B. Mullins
*Assistant Examiner*—Gene Wan
*Attorney, Agent, or Firm*—Spensley, Horn, Jubas & Lubitz

[57] ABSTRACT

In a power amplifier arranged so that a load is driven by a first amplifying circuit having a low distortion factor, the power supply voltage of said first amplifying circuit is varied in accordance with an input signal by a second amplifying circuit having a good power efficiency, to supply always a voltage of a minimum level to said first amplifying circuit whereby to enhance the power efficiency of said first amplifying circuit, wherein arrangement is provided so that the first amplifying circuit is free from the effect of the second amplifying circuit represented by the distortion factor which increases especially in the high frequency range, so that the power amplifier is operated with low distortion factor and high power efficiency even for the high frequency range.

12 Claims, 7 Drawing Figures

POWER AMPLIFIER

BACKGROUND OF THE INVENTION

1. Field of the Invention

The present invention relates to a power amplifier, and more particularly to a power amplifier for audio apparatuses having an improved power efficiency and distortion characteristic especially in high frequency range.

2. Description of the Prior Art

There has been proposed a power amplifier which realizes high power efficiency and low distortion by combining either class-A, or class-AB or class-B amplifying circuit having a low distortion factor and a pulse-width modulation type amplifying circuit having a high power efficiency. This known power amplifier is comprised of, for example, a first amplifying circuit 3 formed with either a class-A or class-AB or class-B amplifying circuit for driving a load 2 in accordance with an input signal applied to an input terminal 1, floating power supplies 6 and 7 for supplying power supply voltages to power-amplifying transistors 4 and 5 of said first amplifying circuit 3, a second amplifying circuit 8 formed with a pulse-width modulation type amplifying circuit for driving the mid-point of said floating power supplies 6 and 7 in accordance with said input signal, and fixed power supplies 9 and 10 for supplying power supply voltages to said second amplifying circuit 8. This known power amplifier is operative so that the load 2 is driven by the first amplifying circuit 3 having a low distortion factor, and that the power supplies 6 and 7 of this first amplifying circuit 3 are controlled by the second amplifying circuit having a high power efficiency in accordance with the input signal so as to always supply a minimum level of voltage to said first amplifying circuit 3 to thereby control the transistors of said first amplifying circuit 3 so as not to saturate, thus elevating the power efficiency of the amplifier. Such power amplifier is shown in, for example, U.S. Pat. No. 4,115,739.

In order to operate this known power amplifier with a high fidelity up to a high frequency range, it is necessary that the second amplifying circuit 8 has a good high frequency range characteristic comparable to that of the first amplifying circuit 3. Otherwise, distortions in high frequency range will become extremely conspicuous. However, in order to improve the high frequency range characteristic of this known amplifier, there is the necessity for setting the carrier frequency high which determines the high frequency range characteristic of the pulse-width modulation type amplifying circuit. If this carrier frequency is to be set at, for example, several 100 kHz, there is the need for the provision of an expensive high-speed power switching element, e.g. a power MOS-FET, so that the known amplifier has the drawback that it is not suitable for practical purposes. Also, an attempt to set the carrier frequency high gives rise to problems such as an abundance of spurious radiation and switching losses.

SUMMARY OF THE INVENTION

It is, therefore, a primary object of the present invention to provide a power amplifier which is capable of realizing a high power efficiency and low signal distortion throughout the entire frequency range from low to high ranges.

Another object of the present invention is to provide a power amplifier of the type described above, which allows the carrier frequency for the pulse-width modulation type amplifying circuit employed therein to be set at a low frequency.

Still another object of the present invention is to provide a power amplifier of the type described above, which, being able to set the carrier frequency at a low frequency, does not require the provision of expensive component elements.

A further object of the present invention is to provide a power amplifier of the type described above, which, due to the capability of setting the carrier frequency at a low frequency, is able to suppress the generation of spurious radiation and switching losses.

DETAILED DESCRIPTION OF THE PREFERRED EMBODIMENTS

Figure 2:
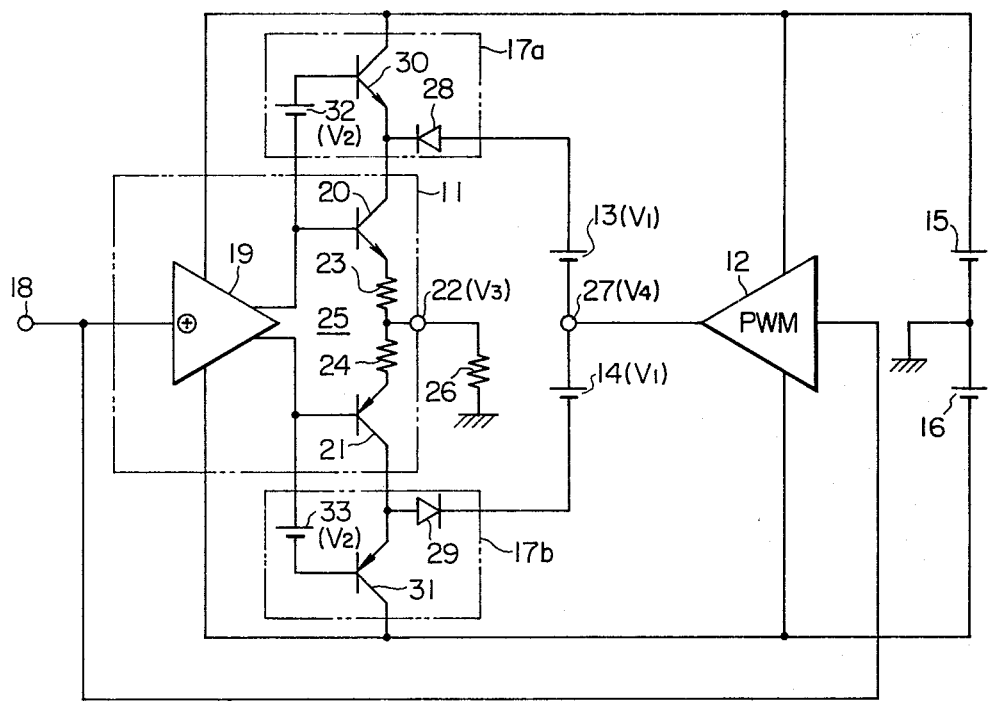
FIG. 2 is a circuit diagram showing an embodiment of the power amplifier according to the present invention.

The power amplifier shown in FIG. 2 is comprised, roughly, of a first amplifying circuit 11, a second amplifying circuit 12, floating power supplies 13 and 14, fixed power supplies 15 and 16, and switching circuits 17a and 17b.

The first amplifying circuit 11 is composed of either a class-A, class-AB or class-B amplifying circuit. This amplifying circuit 11 is comprised of a driver amplifying stage 19 for amplifying an input signal applied to an input terminal 18, and an SEPP-type output stage 25 comprising power-amplifying transistors 20 and 21 driven by said driver amplifying stage 19, and resistors 23 and 24 connected between the respective emitters of these transistors 20 and 21 and an output terminal 22, and arranged so that an output signal derived at the output terminal 22 is supplied to a load 26.

The second amplifying circuit 12 is constructed as a so-called pulse-width modulation (hereinafter to be referred to as PWM) amplifying circuit. In case this circuit is of, for example, an externally triggered type, it is arranged to be operative so that the voltage of an input signal applied to the input terminal 18 is compared with the voltage of a carrier frequency, for example, the voltage of a reference signal having, for example, a triangular waveshape, and being based on the result of this comparison, the power supplied from the fixed supplies 15 and 16 are subjected to switching to form a pulse signal whose pulse width varies in accordance with the input signal level, and that this pulse signal is passed through a low-pass filter to be reformed back into an analog signal to be derived at an output terminal 27.

The floating power supplies 13 and 14 are interposed between the output terminal 27 of the second amplifying circuit 12 and diodes 28 and 29 of the switching circuits 17a and 17b, respectively, so that the voltages from these floating power supplies are arranged to be supplied to the collectors of the transistors 20 and 21, respectively.

The fixed power supplies 15 and 16 are intended to supply positive and negative voltages to the driver amplifying stage 19 of the first amplifying circuit 11, as well as to the second amplifying circuit 12 and the collectors of transistors 30 and 31 of the switching circuits 17a and 17b, respectively.

The switching circuit 17a is composed of the transistor 30 whose collector is connected to the fixed power supply 15 and whose emitter is connected to the collector of the transistor 20 and also to the cathode of the diode 28, and a bias supply 32 connected between the base of the transistor 30 and the base of the transistor 20.

Similarly, the switching circuit 17b is composed of said diode 29, the transistor 31 and a bias supply 33.

These switching circuits 17a and 17b are operated so that when the difference between the values of the output voltages derived at the output terminals 22 and 27 exceeds a certain value, i.e. when the output voltage at the output terminal 27 has become to be no longer able to comply with the output voltage at the output terminal 22, the transistors 30 and 31 are rendered conductive, so that the power supply voltage supplied to the transistors 20 and 21 are switched from the voltages of the floating power supplies 13 and 14 over to the voltages of the fixed power supplies 15 and 16. It should be understood here that the transistors 30 and 31 are arranged to vary their degree of conductivity in accordance with the degree of said difference in voltages. And, in this embodiment, in order that the transistors 30 and 31 will not be rendered conductive during normal operation, the voltages $V_1$ of the floating power supplies 13 and 14 and the voltages $V_2$ of the bias supplies 32 and 33 have the relationship: $V_1 > V_2$, because respective voltages across the base and emitter of the transistors 30 and 31 are substantially equal to respective voltages across the anode and cathode of the diodes 28 and 29.

Figures 3, 4:
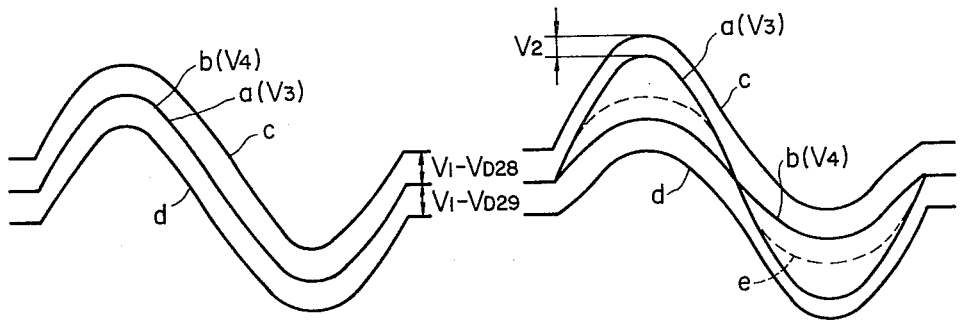
FIG. 3 is a voltage waveshape diagram for explaining the operation, at low frequency range, of the circuit shown in FIG. 2.
FIG. 4 is a voltage waveshape diagram for explaining the operation, at a high frequency range, of the circuit shown in FIG. 2.

Next, the operation of the power amplifier shown in FIG. 2 will hereunder be explained be referring to FIGS. 3 and 4.

To begin with, the gain of the first amplifying circuit 11 is set equal to the gain of the PWM amplifying circuit 12 for the low frequency range (a range of frequencies lower than 1/10 of a carrier frequency), and under this condition there is applied, to the input terminal 18, an input signal having a frequency sufficiently lower than the carrier frequency. Whereupon, the voltage $V_4$ shown by a solid line b in FIG. 3 which is derived at the output terminal 27 of the PWM amplifying circuit 12 will become substantially equal to the voltage $V_3$ indicated by a solid line a in FIG. 3 which is derived at the output terminal 22 of the first amplifying circuit 11, ($V_3 \approx V_4$). This is because of the fact that the frequency of the input signal is substantially lower than the carrier frequency, so that the PWM amplifying circuit 12 performs a satisfactory amplifying operation because this amplifier circuit 12 can follow the input signal. In such instance, to the respective bases of the transistors 30 and 31 of the switching circuits 17a and 17b are applied voltages $V_3 + V_2 + V_{BE}$ and $V_3 - V_2 - V_{BE}$, respectively (wherein: $V_{BE}$ represents a voltage across the base and emitter of the transistors 20 and 21). Also, to the diodes 28 and 29 of the switching circuits 17a and 17b are applied voltages $V_4 + V_1$ and $V_4 - V_1$, respectively. That is, in this state, the base voltage of the transistor 30 of the switching circuit 17a is always rendered to be lower than the anode voltage of the diode 28 due to the conditions $V_1 > V_2$ and $V_3 \approx V_4$. For this reason, a current is supplied to the collector of the transistor 20 from the floating power supply 13 via the diode 28. Also, in the similar fashion, the base voltage of the transistor 31 is rendered always higher than the cathode voltage of the diode 29, so that a current is supplied from the floating power supply 14 to the collector of the transistor 21 via the diode 29. The collector voltages of these transistors 20 and 21 are shown by solid lines c and d in FIG. 3. In this figure, $V_{D28}$ and $V_{D29}$ represent voltages across the anode and the cathode of the diodes 28 and 29, respectively.

As stated above, for the low frequency range, the voltage $V_4$ at the output terminal 27 of the PWM amplifying circuit 12 varies in such relationship as is substantially equal to the voltage $V_3$ at the output terminal 22. Therefore, the collector voltages of the output transistors 20 and 21 will vary being supplied there between with a constant voltage width which is obtained by subtracting the voltages $V_{D28}$ and $V_{D29}$ across the anode and cathode of the diodes 28 and 29 from the voltages of the floating power supplies 13 and 14. Accordingly, there are supplied always a minimum necessary constant voltage to the transistors 20 and 21. Thus, the power loss threat is reduced, and also the power efficiency becomes very high. Furthermore, the PWM amplifying circuit 12 basically has a high power efficiency. Therefore, this part of the circuitry will never aggravate the power efficiency of the amplifying circuit as a whole. On the other hand, the PWM amplifying circuit 12 basically has a poor distortion factor, so that the voltage which is applied, as a power supply voltage, to the transistor 20 and 21 from the output terminal 27 may not be termed as being perfect homologue of the input signal voltage. However, since their transistors 20 and 21 are constructed usually to be operated in the active region, these transistors 20 and 21 have a very large resistance of the collector outputs, and therefore said non-homologousness will not give any adverse effect on the amplifying action of the transistors 20 and 21. Thus, the distortion factor of the amplifier as a whole is determined by the first amplifying circuit 11. Accordingly, if the first amplifying circuit 11 is arranged so as to be operated in, for example, class-A mode, it becomes possible to always realize an amplifier having a low distortion factor.

Next, description will hereunder be made of the operation in a high frequency range.

When an input signal having a high frequency is applied to the input terminal 18, the voltage $V_3$ at the output terminal 22 of the first amplifying circuit 11 is amplified without being acompanied by a lowering of gains as shown in the solid line a in FIG. 4. However, the PWM amplifying circuit 12 will become unable to follow the input signal as this input signal applied is shifted to a higher frequency range. As a result, its gain will drop, and also there will take place rotation of phase. Therefore, the voltage $V_4$ at the output terminal 27 will cease to follow the input signal as indicated by the solid line b in FIG. 4. Such state will be explained with respect to the positive half cycle. When the difference $V_3-V_4$ between the voltage $V_3$ at the output terminal 22 and the voltage $V_4$ at the output terminal 27 becomes $\{(V_3-V_4)>(V_1-V_2)\}$, the base voltage of the transistor 30 will become higher than the anode voltage of the diode 28 in the switching circuit 17a, and also the base voltage of the transistor 31 will become still higher than the cathode voltage of the diode 29 in the switching circuit 17b. In such instance, in the first amplifying circuit 11, a current is supplied from the fixed power supply 15, via the transistor 30 of the switching circuit 17a, to the collector of the transistor 20 as shown by solid line c in FIG. 4. Also, to the collector of the transistor 21 is supplied a current, as shown by solid line d in FIG. 4, from the floating power supply 14 and the output terminal 27 of the PWM amplifying circuit 12 which are connected in series in this order, via the diode 29 of the switching circuit 17b. In this condition, this power amplifier becomes to be arranged so that the transistors in the output stage on the positive side, i.e. the transistors 30 and 20, are cascade-connected so that a power supply voltage is supplied from the fixed power supply 15. Thus, in such arrangement, the distortion factor will not aggravate. Also, in a similar way, for the negative half cycle, this power amplifier becomes to be formed by cascade-connection of the transistors in the output stage on the negative side, i.e. the transistors 31 and 21, and similarly the distortion factor will not aggravate either.

Figure 1:
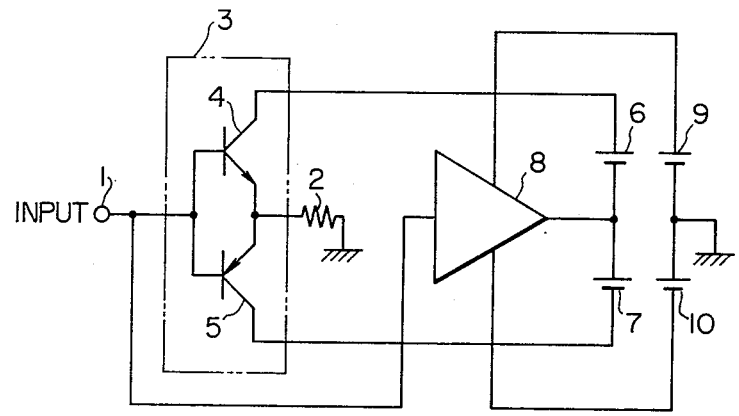
FIG. 1 is a circuit diagram showing an example of known power amplifier.

It should be noted here that the conventional power amplifier shown in FIG. 1 is not provided with like switching circuits 17a and 17b of the amplifier shown in FIG. 2. Accordingly, in such known power amplifier, the output voltage thereof in a high frequency range is clipped as indicated by, for example, the broken line e in FIG. 4, so that distortions are increased.

Figure 5:
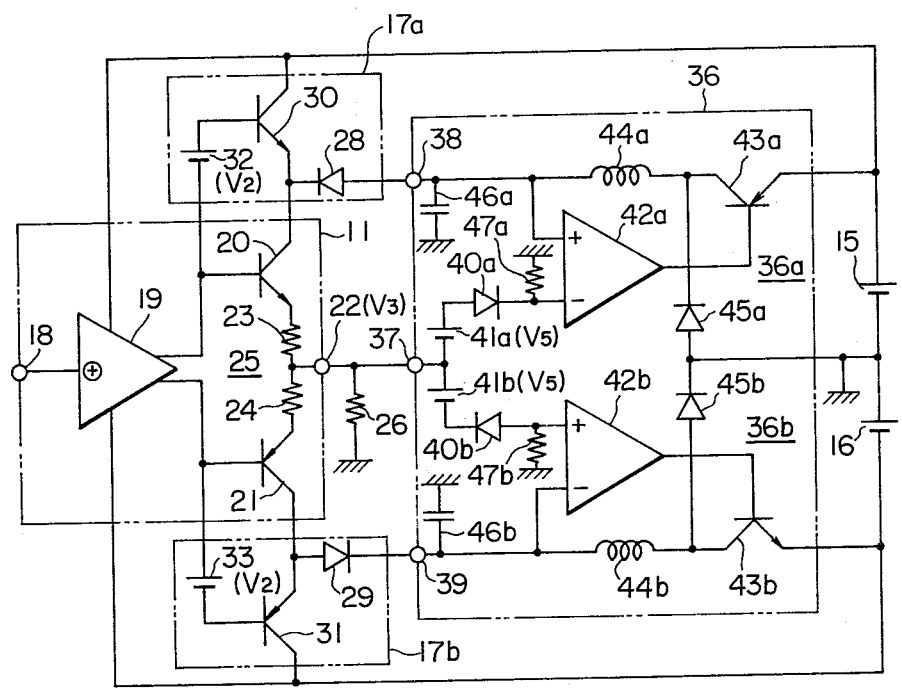
FIG. 5 is a circuit diagram of another embodiment of the power amplifier according to the present invention.

Next, description will be made hereunder with respect to another embodiment of the present invention shown in FIG. 5. Those parts identical with those shown in the first embodiment in FIG. 2 are indicated by like reference numerals.

This second embodiment is such that the second amplifying circuit 12 shown in FIG. 2 is constructed by a self-exciting type switching power supply circuit 36, and that the functions corresponding to the floating power supplies 13 and 14 of FIG. 2 are given this self-exciting type switching power supply circuit 36. More particularly, the switching power supply circuit 36 is comprised of an amplifying section 36a for delivering, from an output terminal 38, to a transistor 20 a positive power supply voltage corresponding to an input signal applied to an input terminal 37, and an amplifying section 36b for delivering, from an output terminal 39, to a transistor 21 a negative power supply voltage corresponding to said input signal.

The amplifying section 36a is comprised of: a comparator 42a having its non-inverting input terminal connected to the output terminal 38 connected to the anode of a diode 28 and its inverting terminal grounded via a resistor 47a and also connected to the input terminal 37 via a diode 40a and a bias supply 41a; a transistor 43a for switching the voltage of a fixed power supply 15 in accordance with the output of this comparator 42a to deliver it to the output terminal 38 side; a low-pass filter which is connected between said transistor 43a and the output terminal 38 and comprised of a coil 44a and a capacitor 46a for smoothing the switching voltage; and a diode 45a inserted between the transistor 43a and the ground.

Similarly, the amplifying section 36b is composed of a resistor 47b, a diode 40b, a bias supply 41b, a comparator 42b, a transistor 43b, a coil 44b, a capacitor 46b, and a diode 45b.

It should be understood here that, in this power amplifier, arrangement is provided so that the gains of the amplifying sections 36a and 36b for the low frequency range are set to be one (1), and the voltage $V_5$ of the bias supplies 41a and 41b and the voltage $V_2$ of bias supplies 32 and 33 have the relationship $V_5-V_{D40}>V_2+V_{BE}$ (wherein: $V_{D40}$ represents a voltage across the anode and the cathode of the respective diodes 41a and 41b, and $V_{BE}$ represents a voltage across the base and the emitter of the respective transistors 20 and 21).

Description will next be made of the operation of the second embodiment having the foregoing arrangement. To begin with, in the positive half cycle, and for the input signal of the low frequency, the amplifying section 36a is operated similarly to the operations of the floating power supply 13 and the PWM amplifying circuit 12 which have been described in connection with FIG. 2, in such way that the output voltage at the output terminal 38 will become higher than the output voltage $V_3$ at an output terminal 22 by an amount of voltage $(V_5-V_{D40})$. Also, for an input signal in the high frequency range, the output signal at the output terminal 38 will cease to follow the input signal in the same manner as that of the PWM amplifying circuit 12 shown in FIG. 2.

On the other hand, for the negative half cycle also, in the similar way as for the positive half cycle, the amplifying section 36b will operate in the same way as the operations of the floating power supply 14 and the PWM amplifying circuit 12 such that, for an input signal in the low frequency range, the output voltage at the output terminal 39 will become a voltage lower by an amount of voltage $(V_5-V_{D40})$ than the output voltage at the output terminal 22. Furthermore, for an input signal in the high frequency range, the output signal at the output terminal 39 will cease to follow the input signal in the same way as with the PWM amplifying circuit 12 shown in FIG. 2.

Figures 6, 7:
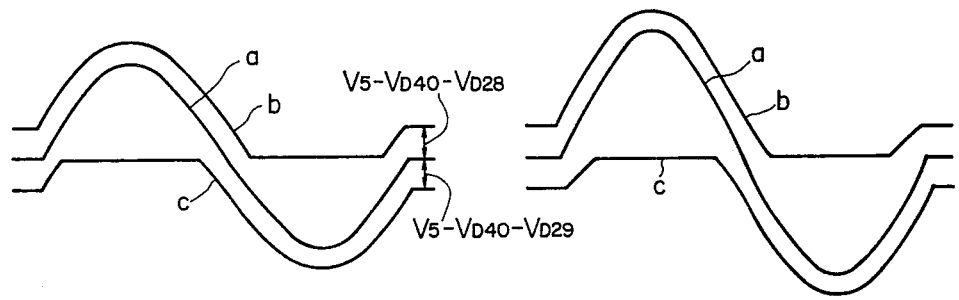
FIG. 6 is a voltage waveshape diagram for explaining the operation, at a low frequency range, of the circuit shown in FIG. 5.
FIG. 7 is a voltage waveshape diagram for explaining the operation, at a high frequency range, of the circuit shown in FIG. 5.

And, in case the output signals of the amplifying sections 36a and 36b fail to follow the input signal, there is performed a switching-over of the power supply voltages, and thus there is obtained an operation similar to that of the power amplifier shown in FIG. 2. It should be understood here that FIG. 6 shows the voltage wave-shapes of the respective parts in the low frequency range, and FIG. 7 shows the voltage waveshapes of the respective parts in the high frequency range. In each figure, the solid line a represents a voltage waveshape at the output terminal 22, whereas the solid lines b and c represent collector voltage waveshapes of the transistors 20 and 21.

What is claimed is:

1. A power amplifier, comprising:
    a first amplifying circuit having amplifying elements for amplifying an input signal in either class-A, class-B or class-AB mode, to drive a load;
    a second amplifying circuit using, as an input, a signal corresponding to said input signal for supplying to said amplifying elements an output voltage as a first power supply voltage;
    fixed power supplies supplying a second power supply voltage to said second amplifying circuit; and switching circuits for switching between said first power supply voltage and said second power supply voltage to be delivered to said amplifying elements in accordance with a potential difference between an output voltage of said first amplifying circuit and the output voltage of said second amplifying circuit.

2. A power amplifier according to claim 1, wherein said first amplifying circuit is an SEPP circuit using balanced power supplies.

3. A power amplifier according to claim 1, wherein said second amplifying circuit comprises:
   a PWM amplifying circuit inputting thereto a signal identical with an input signal applied to said first amplifying circuit and having a gain in the low frequency range set identical with a gain of said first amplifying circuit; and
   floating power supplies for elevating an absolute value of an output voltage of said PWM amplifying circuit by a predetermined level to provide said first power supply voltage.

4. A power amplifier according to claim 1, wherein said second amplifying circuit comprises:
   bias supplies for elevating an absolute value of the output voltage of said first amplifying circuit by a predetermined level; and
   a third amplifying circuit having its gain set at one (1) for performing switching and amplifying of a voltage elevated by said bias supplies to provide said first power supply voltage.

5. A power amplifier according to claim 4, wherein said third amplifying circuit comprises:
   digital switching elements for switching the voltages of said fixed power supplies;
   low-pass filters for smoothing output voltages of said switching elements; and
   comparators for comparing said elevated voltage with an output voltage from said low-pass filters to drive said switching elements based on a result of comparison.

6. A power amplifier according to claim 3 or 5, wherein said switching circuits comprise:
   analog switching circuits for supplying, when said potential difference is below a predetermined value, said first power supply voltage to said amplifying elements, and for being rendered conductive, whenever said potential difference exceeds said predetermined value, in accordance with said potential difference to supply said second power supply voltage to said amplifying elements.

7. A power amplifier according to claim 6, wherein said analog switching circuits comprise:
   transistors cascade-connected between said amplifying elements and said fixed power supplies; and
   diodes for supplying an output voltage of said second amplifying circuit to a common connecting point of said transistors and said amplifying elements to control the conduction of said transistors.

8. A power amplifier comprising:
   a first amplifying circuit for amplifying an input signal to drive a load;
   first supply means for supplying a first power supply voltage to the first amplifying circuit;
   second supply means for supplying a second power supply voltage to the amplifying circuit; and
   switching means for switching between the first power supply voltage and the second power supply voltage as a function of the frequency of the input signal.

9. A power amplifier according to claim 8 wherein second supply means includes fixed power supplies.

10. A power amplifier according to claim 9 wherein the first supply means comprises:
    a pulse width modulating amplifier which receives the input signal and has a gain in a low frequency range which is substantially the same as the gain of the first amplifying circuit; and
    first and second floating power supplies for elevating the absolute value of the output voltage of the pulse width modulating amplifier by a predetermined amount to provide the first power supply voltage.

11. A power amplifier according to claim 9 wherein the first supply means also includes the fixed supplies and further comprises a self-exciting power supply connected to the fixed power supplies, wherein the self-exciting power supply includes a switching amplifier circuit for switching the fixed supplies to provide the first power supply voltage.

12. A power amplifier comprising:
    a first amplifying circuit for amplifying an input signal to drive a load;
    a second amplifying circuit receiving the input signal as an input and providing an output voltage as a first power supply voltage to the first amplifying circuit;
    fixed power supplies for supplying a second power supply voltage to the second amplifying circuit; and
    switching circuits for switching between the first power supply voltage and the second power supply voltage to be delivered to the first amplifying circuit, wherein the switching is done as a function of the difference between the output voltage of the first amplifying circuit and the output voltage of the second amplifying circuit.

* * * * *